United States Patent
Staszewski et al.

(10) Patent No.: US 7,183,860 B2
(45) Date of Patent: Feb. 27, 2007

(54) GAIN CALIBRATION OF A DIGITAL CONTROLLED OSCILLATOR

(75) Inventors: Robert B. Staszewski, Garland, TX (US); Gennady Feygin, Plano, TX (US); Oren E. Eliezer, Plano, TX (US); Dirk Leipold, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 74 days.

(21) Appl. No.: 11/149,859

(22) Filed: Jun. 10, 2005

(65) Prior Publication Data

US 2006/0033582 A1    Feb. 16, 2006

Related U.S. Application Data

(60) Provisional application No. 60/601,374, filed on Aug. 12, 2004.

(51) Int. Cl.
*H03C 3/06* (2006.01)
*H03L 7/091* (2006.01)
*H03L 7/099* (2006.01)

(52) U.S. Cl. .................. 331/1 A; 331/14; 331/17; 331/25; 327/159; 332/127; 375/376

(58) Field of Classification Search ............. 331/1 A, 331/14, 17, 18, 25, 34, 179; 327/105–107, 327/156–159; 332/127; 360/51; 375/376; 455/260
See application file for complete search history.

(56) References Cited

U.S. PATENT DOCUMENTS 7,046,098 B2 * 5/2006 Staszewski ............... 331/158

OTHER PUBLICATIONS

"A 2.5-Mb/s GFSK 5.0-Mb/s 4-FSK Automatically Calibrated Σ-Δ Frequency Synthesizer", Daniel R. McMahill and Charles G. Sodini, IEEE Journal of Solid-State Circuits, vol. 37, No. 1, Jan. 2002, pp. 18-26.
"All-Digital Phase-Domain TX Frequency Synthesizer for Bluetooth Radios in 0.13μm CMOS", Robert B. Staszewski, et al., IEEE International Solid-State Circuits Conference, Session 15, Wireless Consumer ICs 15.3, Jun. 2004, pp. 1-10.
"All Digital PLL and GSM/EDGE Transmitter in 90nm CMOS", IEEE International Solid State Circuits Conference, Session 17, RF Cellular ICs, 17.5, 2005, pp. 316-317 Figure 17.5.7: Die Micrograph.
"Automatic Calibration of Modulated Frequency Synthesizers", IEEE Transactions on Circuits and Systems-II: Analog and Digital Signal Processing, vol. 29, No. 5, May 2002, pp. 301-311.
"Just-In-Time Gain Estimation of an RF Digitally-Controlled Oscillator", Robert B. Staszewski, et al., IEEE Custom Integrated Circuits Conference, Proc of May 2003, pp. 571-574.

(Continued)

*Primary Examiner*—David Mis
(74) *Attorney, Agent, or Firm*—Ronald O. Neerings; Wade J. Brady, III; Frederick J. Telecky, Jr.

(57) ABSTRACT

A novel apparatus for and a method of estimating, calibrating and tracking in real-time the gain of a radio frequency (RF) digitally controlled oscillator (DCO) in an all-digital phase locked loop (ADPLL). Precise setting of the inverse DCO gain in the ADPLL modulating path allows direct wideband frequency modulation that is independent of the ADPLL loop bandwidth. The gain calibration technique is based on a steepest descent iterative algorithm wherein the phase ADPLL error is sampled and correlated with the modulating data to generate a gradient. The gradient is then scaled and added to the current value of the DCO gain multiplier.

39 Claims, 12 Drawing Sheets

OTHER PUBLICATIONS

"Just-In-Time Gain Estimation of an RF Digitally-Controlled Oscillator for Digital Direct Frequency Modulation", Robert B. Staszewki et al., IEEE Transactions on Circuits and Systems-II: Analog and Digital Signal Processing, vol. 50, No. 11, Nov. 2003, pp. 887-892.

"Phase-Domain All-Digital Phase-Locked Loop", Robert B. Staszewski, et al., IEEE Transactions on Circuits and Systems-II: Express Briefs, vol. 52, No. 3, Mar. 2005, pp. 159-163.

* cited by examiner

GAIN CALIBRATION OF A DIGITAL CONTROLLED OSCILLATOR

REFERENCE TO RELATED APPLICATION

This application claims priority to U.S. Provisional Application Ser. No. 60/601,374, filed Aug. 12, 2004, entitled "New LMS-Based $K_{DCO}$ Algorithm", incorporated herein by reference in its entirety.

FIELD OF THE INVENTION

The present invention relates to the field of data communications and more particularly relates to an apparatus for and method of LMS-based gain calibration technique for a radio frequency (RF) digitally controlled oscillator (DCO) in an all digital phase locked loop (ADPLL).

BACKGROUND OF THE INVENTION

Oscillators are a key component in the design of radio frequency (RF) communication systems.

The estimation and calibration of the modulation gain of an RF oscillator is currently an area of active research. Accurate knowledge of this gain significantly reduces the complexity and increases the performance of the transmit frequency modulation path. It is particularly beneficial in systems implemented in deep submicron CMOS and based on orthogonal frequency/phase and amplitude (i.e. polar) topology. Estimation of RF oscillator frequency-modulation gain is especially important in low-cost high-volume transceivers. In such systems, the phase locked loop sets the loop bandwidth while the transmitter sets the transfer function of the direct frequency modulation path wherein the acceptable gain estimation error ranges from less than 1% for CDMA to several percents for GSM and Bluetooth, for example.

A well-known method for achieving indirect frequency/phase modulation is the use of sigma-delta modulation of the feedback division ratio in a fractional-N PLL frequency synthesizer, described in T. Riley et al., "A simplified continuous time modulation technique," IEEE Trans. on Circuits and Systems II, Vol. 41, no. 5, pp. 321–328, May 1994.

To compensate high-frequency attenuation in a PLL with limited bandwidth, a prior art technique to boost high-frequency components in the digital modulating signal is described in M. H. Perrott et al., "A 27-mW CMOS fractional-N synthesizer using digital compensation for 2.5 Mb/s GFSK modulation," IEEE J. Solid-State Circuits, vol. 32, no. 12, pp. 2048–2060, Dec. 1997. Unfortunately, the PLL frequency response is subject to process, voltage and temperature (PVT) variations of the charge pump, loop filter and voltage controlled oscillator (VCO). To match the precompensation filter to the inverse frequency response of the PLL, a prior art automatic online calibration technique is described in D. R. McMahill et al., "A 2.5 Mb/s GFSK 5.0 Mb/s 4-FSK automatically calibrated Σ-Δ frequency synthesizer," IEEE J. Solid-State Circuits, vol. 37, no. 1, pp. 18–26, January 2002. This technique is adapted to measure the phase error between the demodulated RF output and the reference input and adjust the PLL loop gain via the charge pump current. A disadvantage of this technique, however, is the cost of additional circuitry amounting to approximately ⅓ of the PLL, including a reference error filter, DPLL, vector test and RF phase quantizer. Further, this technique suffers from a slow time constant of 200 ms. Another prior art calibration technique that measures the PLL loop magnitude response to a training tone whose frequency is located slightly beyond the loop bandwidth is described in S. T. Lee et al., "A quad-band GSM-GPRS transmitter with digital auto-calibration," IEEE J. Solid State Circuits, vol. 39, no. 12, pp. 2200–2214, December 2004.

A two-point direct modulation scheme is described in M. Bopp et al., "A DECT transceiver chip set using SiGe technology," Proc. of IEEE Solid-State Circuits Conf., pp. 68–69, 447, February 1999. This modulation scheme directly controls the oscillator frequency while compensating for the resulting loop reaction. A disadvantage of this approach, however, is that it is mostly analog in nature and requires precise calibration of the oscillator and other PLL analog components. A fully-digital approach is described in R. B. Staszewski et al., "Just-in-time gain estimation of an RF digitally-controlled oscillator for digital direct frequency modulation," IEEE Trans. on Circuits and Systems II, vol. 50, no. 11, pp. 887–892, November 2003. This fully digital technique only requires calibration of the oscillator. The calibration digitally estimates the oscillator modulation gain before each packet by forcing an exact frequency step and digitally measuring the dc loop response as described in R. B. Staszewski et al., "Just-in-time gain estimation of an RF digitally-controlled oscillator," Proc. of 2003 IEEE Custom Integrated Circuits Conf., pp. 571–574, September 2003.

The prior art techniques discussed hereinabove suffer from disadvantages such as they (1) require a dedicated time for background calibration, which makes them suitable only for packetized operations, such as GSM/EDGE, but not WCDMA, (2) require dedicated and expensive hardware, (3) are dc based and are thus sensitive to frequency drift of the oscillator, or (4) require factory calibration. There is thus a need for a gain calibration technique that consumes little additional hardware, is very accurate, can continuously track changes in the gain with temperature and/or supply voltage and can adapt using either the training sequence or user data. Further it is desirable that the gain calibration technique be suitable for use in UMTS (i.e. GSM/EDGE and WCDMA) applications. In the case of non-constant envelope signaling, the gain calibration technique should be applicable to the frequency/phase portion of a polar modulation transmitter.

SUMMARY OF THE INVENTION

The present invention is a novel apparatus for and a method of estimating, calibrating and tracking in real-time the gain of a radio frequency (RF) digitally controlled oscillator (DCO) in an all-digital phase locked loop (ADPLL). The precise setting of the inverse DCO gain in the ADPLL modulating path allows direct wideband frequency modulation that is independent of the ADPLL loop bandwidth. The gain calibration technique is based on a steepest descent iterative algorithm wherein the ADPLL phase error is sampled and correlated with the modulating data to generate a gradient. Other well known variants of LMS, such as sign-sign or sign-error may be employed with similar effect. The gradient is then scaled and added to the current value of the DCO gain multiplier. This process, repeated over time, results in an improved estimate of the true DCO gain that ensures optimum performance and allows continuous operation in the presence of possible sources of variability, such as temperature changes.

The invention is applicable to any system in which it is desirable to estimate, calibrate and track the gain of a digitally controlled RF oscillator such as in mobile phones and other wireless applications. The invention is intended for use in a digital radio transmitter or transceiver but can be used in other applications as well, such as a general communication channel. The present invention provides a solution to the problems and disadvantages of prior art gain calibration techniques.

The LMS-based DCO gain calibration technique has several advantages. The gain calibration technique (1) is able to track and cancel oscillator frequency drift, (2) consumes relatively little additional hardware (i.e. less than 1000 gates), (3) can be performed during actual use and does not require any factory calibration time, (4) is very accurate, (5) can perform gain adaptation with the training sequence or random user data, and (6) is relatively quick, having a time constant on the order of 30 μs. The invention is applicable for use with UMTS (GSM/EDGE and WCDMA) and other wireless communication systems. In case of non-constant envelope signaling, the proposed technique would apply to the frequency/phase part of a polar modulation transmitter.

An embodiment of the invention has been successfully demonstrated in a polar-modulation transmitter adapted for use in packetized communication systems (e.g., GSM/EDGE systems) and is also applicable for use in full-duplex communication systems (e.g., WCDMA systems). The gain calibration scheme has been successfully incorporated in a single chip fully compliant GSM/EDGE transceiver realized in a 90 nm digital CMOS process and could be extended to other standards as well. Laboratory measurements indicate good correlation with simulations and demonstrate gain adaptation convergence to within ±1%.

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is thus provided in accordance with the present invention, a method of gain calibration of a digitally controlled oscillator (DCO), the method comprising the steps of sampling a phase error signal continuously or upon zero crossing of an input data frequency control word (FCW) to generate phase error samples therefrom, generating a gradient in accordance with the phase error sample and a sign of the data FCW and adjusting an oscillator gain estimate K in accordance with the gradient.

There is also provided in accordance with the present invention, a method of gain calibration of a digitally controlled oscillator (DCO) for use in an all-digital phase locked loop (ADPLL), the method comprising the steps of sampling ADPLL phase error to generate a phase error sample, correlating the phase error sample with modulation data to generate a gradient, scaling the gradient to generate a scaled gradient and adding the scaled gradient to a current value of DCO gain multiplier to generate an updated DCO gain multiplier.

There is further provided in accordance with the present invention, an apparatus for gain calibration of a digitally controlled oscillator (DCO) comprising a sampler operative to sample a phase error input and to output phase error samples therefrom, gradient means for generating a gradient as a function of the phase error samples and the sign of modulating data, scaling means operative to generate a scaled gradient from the output of the gradient means and an accumulator operative to add the scaled gradient to a current value of a DCO gain multiplier value.

There is also provided in accordance with the present invention, an apparatus for generating a digitally controlled oscillator (DCO) gain multiplier comprising means for sampling a phase error to generate a phase error sample, means for correlating the phase error sample with modulation data to generate a gradient, means for scaling the gradient to generate a scaled gradient and means for adding the scaled gradient to a current value of DCO gain multiplier to generate an updated DCO gain multiplier.

There is further provided in accordance with the present invention, a transmitter comprising a frequency synthesizer for performing a frequency modulation; the frequency synthesizer comprising a digitally controlled oscillator (DCO), a gain calibration circuit of the digitally controlled oscillator, the gain calibration circuit comprising means for sampling a phase error to generate a phase error sample, means for correlating the phase error sample with modulation data to generate a gradient, means for scaling the gradient to generate a scaled gradient and means for adding the scaled gradient to a current value of DCO gain multiplier to generate an updated DCO gain multiplier.

BRIEF DESCRIPTION OF THE DRAWINGS

The invention is herein described, by way of example only, with reference to the accompanying drawings, wherein.

DETAILED DESCRIPTION OF THE INVENTION

Figure 1:
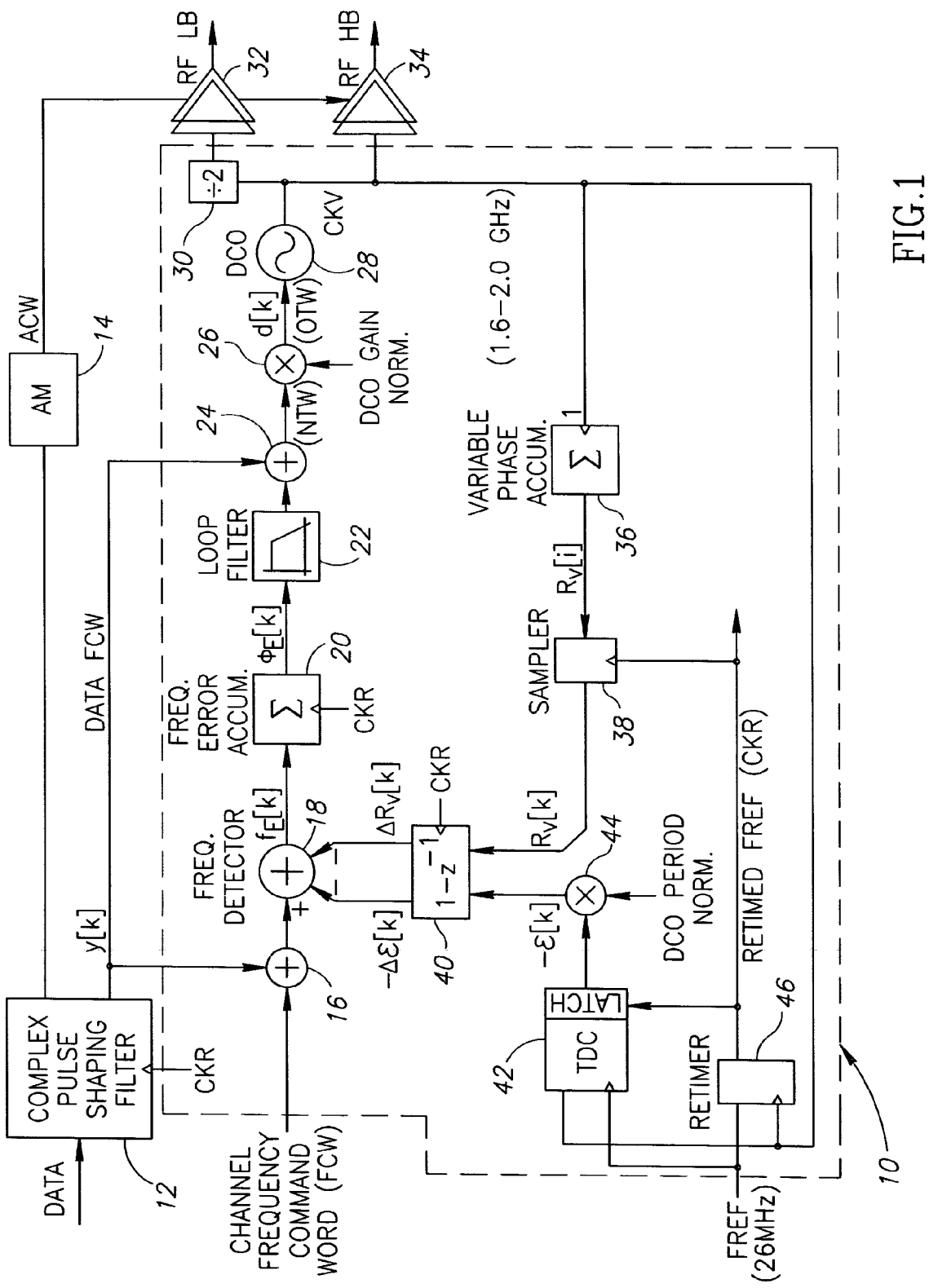
FIG. 1 is a block diagram illustrating an all digital phase locked loop (ADPLL) based polar transmitter constructed in accordance with the present invention.

Notation Used Throughout
The following notation is used throughout this document.

| Term | Definition |
|---|---|
| ADPLL | All Digital Phase Locked Loop |
| ASIC | Application Specific Integrated Circuit |
| CDMA | Code Division Multiple Access |
| CKR | Retimed Reference Clock |
| CKV | Variable Oscillator Clock |
| CMOS | Complementary Metal Oxide Semiconductor |
| DCO | Digitally Controlled Oscillator |
| DECT | Digital Enhanced Cordless Telecommunications |
| DRP | Digital RF Processor or Digital Radio Processor |
| EDGE | Enhanced Data rates for GSM Evolution |
| FCW | Frequency Command Word |
| FPGA | Field Programmable Gate Array |
| FREF | Frequency Reference |
| GFSK | Gaussian Frequency Shift Keying |
| GSM | Global System for Mobile Communications |
| HB | High Band |
| HDL | Hardware Description Language |
| IC | Integrated Circuit |
| LB | Low Band |
| LMS | Least Mean Squares |
| LPF | Low Pass Filter |
| MOSCAP | Metal Oxide Semiconductor Capacitor |
| PLL | Phase Locked Loop |
| PVT | Process, Voltage, Temperature |
| RF | Radio Frequency |
| RMS | Root Mean Square |
| TDC | Time to Digital Converter |
| UMTS | Universal Mobile Telecommunications System |
| VCO | Voltage Controlled Oscillator |
| WCDMA | Wideband Code Division Multiple Access |

DETAILED DESCRIPTION OF THE INVENTION

The present invention is an apparatus for and method of calibrating the gain of an RF or non-RF digitally controlled oscillator (DCO). The invention is applicable to any system in which it is desirable to estimate, calibrate and track the gain of an RF digitally controlled oscillator such as in mobile phones and other wireless applications. The invention is intended for use in a digital radio transmitter or transceiver but can be used in other applications as well, such as a general communication channel. The present invention provides a solution to the problems and disadvantages of prior art gain calibration techniques.

To aid in understanding the principles of the present invention, the description is provided in the context of a digital RF processor (DRP) transmitter and receiver that may be adapted to comply with a particular wireless communications standard such as GSM, Bluetooth, WCDMA, etc. It is appreciated, however, that the invention is not limited to use with any particular communication standard and may be used in optical, wired and wireless applications. Further, the invention is not limited to use with a specific modulation scheme but is applicable to any modulation scheme including both digital and analog modulation. The invention is applicable to any system in which it is desirable to estimate, calibrate and track the modulation gain of a digitally controlled oscillator.

Note that throughout this document, the term communications device is defined as any apparatus or mechanism adapted to transmit, or transmit and receive data through a medium. The communications device may be adapted to communicate over any suitable medium such as RF, wireless, infrared, optical, wired, microwave, etc. In the case of wireless communications, the communications device may comprise an RF transmitter, RF receiver, RF transceiver or any combination thereof. The notation DRP is intended to denote either a Digital RF Processor or Digital Radio Processor. References to a Digital RF Processor infer a reference to a Digital Radio Processor and vice versa.

A block diagram illustrating an all digital phase locked loop (ADPLL) based polar transmitter constructed in accordance with the present invention is shown in FIG. 1. For illustration purposes only, the transmitter, as shown, is adapted for the GSM/EDGE cellular standard. It is appreciated, however, that one skilled in the communication arts can adapt the transmitter illustrated herein to other modulations and communication standards as well without departing from the spirit and scope of the present invention. For example, the transmitter illustrated in FIG. 1 can be extended for performing an arbitrary quadrature modulation scheme.

A description of the ADPLL, generally referenced 10, including the frequency/phase modulation path is provided hereinbelow. The core of the ADPLL is a digitally controlled oscillator (DCO) 28 adapted to generate the RF oscillator clock CKV. The oscillator core (not shown) operates at twice the 1.6–2.0 GHz high frequency band or four times the 0.8–1.0 GHz low frequency band. The output of the DCO is then divided for precise generation of RX quadrature signals, and for use as the transmitter's carrier frequency. The single DCO is shared between transmitter and receiver and is used for both the high frequency bands (HB) and the low frequency bands (LB). An additional 4-bits of the tracking bank are dedicated for $\Sigma\Delta$ dithering in order to improve frequency resolution, as described in more detail infra. The DCO varactors may be realized as n-poly/n-well MOS capacitor (MOSCAP) devices that operate in the flat regions of their C-V curves. The finest step size (i.e. DCO gain) is about 12 kHz/LSB which is subject to changes in PVT. The output of the DCO is input to the RF high band power amplifier 34. It is also input to the RF low band power amplifier 32 after divide by 2 in divider 30.

The expected variable frequency $f_V$ is related to the reference frequency $f_R$ by the frequency command word (FCW).

$$FCW[k] \equiv \frac{E(f_V[k])}{f_R} \qquad (1)$$

The FCW is time variant and is allowed to change with every cycle $T_R = 1/f_R$ of the frequency reference clock. With $W_F=24$ the word length of the fractional part of FCW, the ADPLL provides fine frequency control with 1.5 Hz accuracy, according to:

$$\Delta f_{res} = \frac{f_R}{2^{W_F}} \quad (2)$$

The number of integer bits $W_1=8$ was chosen to fully cover the GSM band frequency range of $f_V=1{,}600{-}2{,}000$ MHz with an arbitrary reference frequency $f_R \geq 8$ MHz.

The ADPLL operates in a digitally-synchronous fixed-point phase domain as follows: The variable phase accumulator 36 determines the variable phase $R_V[i]$ by counting the number of rising clock transitions of the DCO oscillator clock CKV as expressed below.

$$R_V[i] = \sum_{l=0}^{i} 1 \quad (3)$$

The index i indicates the DCO edge activity. The variable phase $R_V[i]$ is sampled via sampler 38 to yield sampled FREF variable phase $R_V[k]$, where k is the index of the FREF edge activity. The sampled FREF variable phase $R_V[k]$ is fixed-point concatenated with the normalized time-to-digital converter (TDC) 42 output $\epsilon[k]$. The TDC measures and quantizes the time differences between the frequency reference FREF and the DCO clock edges. The sampled differentiated (via block 40) variable phase is subtracted from the frequency command word (FCW) by the digital frequency detector 18. The frequency error $f_E[k]$ samples $$f_E[k]=FCW-[(R_V[k]-\epsilon[k])-(R_V[k-1]-\epsilon[k-1])] \quad (4)$$

are accumulated via the frequency error accumulator 20 to create the phase error $\phi_E[k]$ samples $$\phi_E[k] = \sum_{l=0}^{k} f_E[k] \quad (5)$$

which are then filtered by a fourth order IIR filter 22 and scaled by a proportional loop attenuator $\alpha$. parallel feed with coefficient $\rho$ adds an integrated term to create type-II loop characteristics which suppresses the DCO flicker noise.

The IIR filter is a cascade of four single stage filters, each satisfying the following equation:

$$y[k]=(1-\lambda)\cdot y[k-1]+\lambda \cdot x[k] \quad (6)$$

wherein
x[k] is the current input;
y[k] is the current output;
k is the time index;
$\lambda$ is the configurable coefficient;

The 4-pole IIR filter attenuates the reference and TDC quantization noise with an 80 dB/dec slope, primarily to meet the GSM spectral mask requirements at 400 kHz offset. The filtered and scaled phase error samples are then multiplied by the DCO gain $K_{DCO}$ normalization factor $f_R/\hat{K}_{DCO}$ via multiplier 26, where $f_R$ is the reference frequency and $\hat{K}_{DCO}$ is the DCO gain estimate, to make the loop characteristics and modulation independent from $K_{DCO}$. The modulating data is injected into two points of the ADPLL for direct frequency modulation, via adders 16 and 24. A hitless gear-shifting mechanism for the dynamic loop bandwidth control serves to reduce the settling time. It changes the loop attenuator $\alpha$ several times during the frequency locking while adding the $(\alpha_1/\alpha_2-1)\phi_1$ dc offset to the phase error, where indices 1 and 2 denote before and after the event, respectively. Note that $\phi_1=\phi_2$, since the phase is to be continuous.

The FREF input is resampled by the RF oscillator clock CKV via retimer block 46 which may comprise a flip flop or register clocked by the reference frequency FREF. The resulting retimed clock (CKR) is distributed and used throughout the system. This ensures that the massive digital logic is clocked after the quiet interval of the phase error detection by the TDC.

Figure 2:
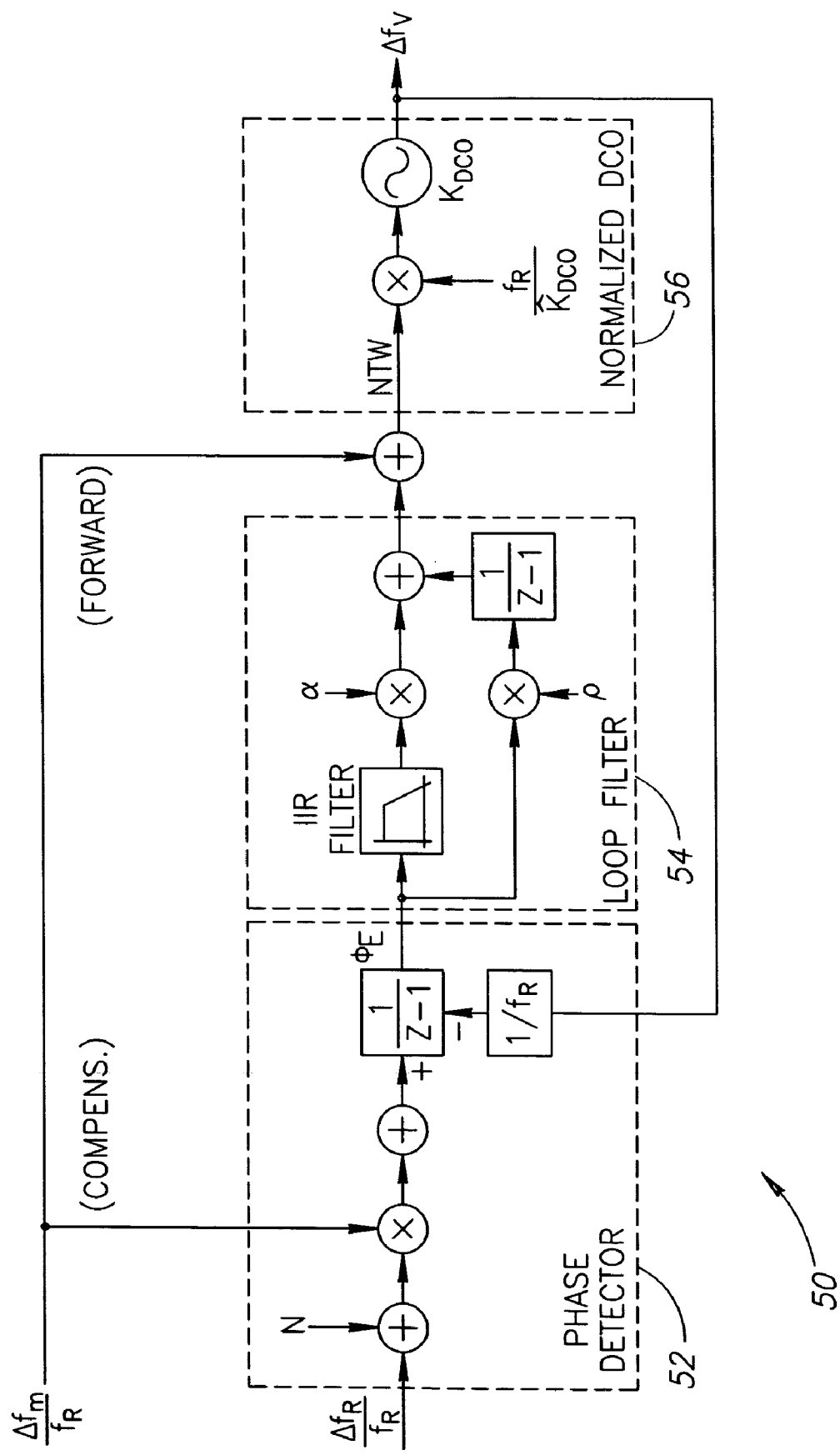
FIG. 2 is a block diagram illustrating a z-domain model of the ADPLL with wideband frequency modulation without the present invention.

In the example embodiment described herein, the ADPLL is a discrete-time sampled system implemented with all digital components connected with all digital signals. Consequently, the z-domain representation is a natural fit and is also accurate with no necessity for approximations that would result, for example, in an impulse response transformation due to the use of analog loop filter components. A block diagram illustrating a z-domain model of the ADPLL wideband frequency modulation path without the present invention is shown in FIG. 2. The model, generally referenced 50, comprises a phase detector portion 52, loop filter portion 54 and normalized DCO portion 56.

The fixed-point modulating data $\Delta f_m/f_R$ ($y[k] \equiv \Delta f_m/f_R$ in FIG. 1) directly affects the oscillating frequency $f_V$ through the feedforward path. The phase locked loop will try to correct this perceived frequency perturbation integrated over the update period of $1/f_R$. This corrective action is compensated by the other compensating feed. The loop response is wideband and the data directly modulates the DCO frequency in a feed-forward manner such that it effectively removes the loop dynamics from the modulating transmit path. The rest of the loop, however, including all error sources, operates under the normal closed loop regime.

The z-domain transfer function from both feeds of the modulating data to the frequency deviation $\Delta f_V$ at the output of the PLL is $$H(z) = \left[1 + \frac{L(z)}{z-1}\right]\left[\frac{r \cdot f_R}{1 + r \cdot \frac{L(z)}{z-1}}\right] \quad (7)$$

where

L(z) is the loop filter transfer function;

$r=K_{DCO}/\hat{K}_{DCO}$

H(z) could be simplified to $$H(z) = r \cdot f_R \frac{z - [1-L(z)]}{z - [1-r \cdot L(z)]} \quad (8)$$

The PLL loop has a pole at $[1-r \cdot L(z)]$ and a zero at $[1-L(z)]$. The dc gain is always unity, when normalized to $f_R$, which could be readily seen by inspection: $H(z)|_{z=1}=f_R$. The high frequency gain is $H(z)|_{z=-1} \cong r \cdot f_R$, since $L(z) \ll 1$.

An approximate rule for $r=K_{DCO}/\hat{K}_{DCO} \cong 1$ can be stated as follows. Frequency components of the modulating data within the loop bandwidth are accurately represented at the RF output, whereas the frequency components higher than the loop bandwidth are slightly magnified if r>1 or attenuated if r<1. If the DCO gain is estimated accurately then the modulation bandwidth is all-pass from dc to half of the reference frequency $f_R$, with 26 MHz being the most commonly used $f_R$. In this fashion, the loop dynamics are removed from the modulation path, while the noise and error sources undergo normal closed loop attenuation. It could be shown that to meet, for example, GSM specifications, with a loop bandwidth of 40 kHz and damping factor of $\zeta=1/\sqrt{2}$, the estimated DCO gain error should satisfy: $|r-1| \leq 7\%$, which can be achieved with the present invention.

Figure 3:
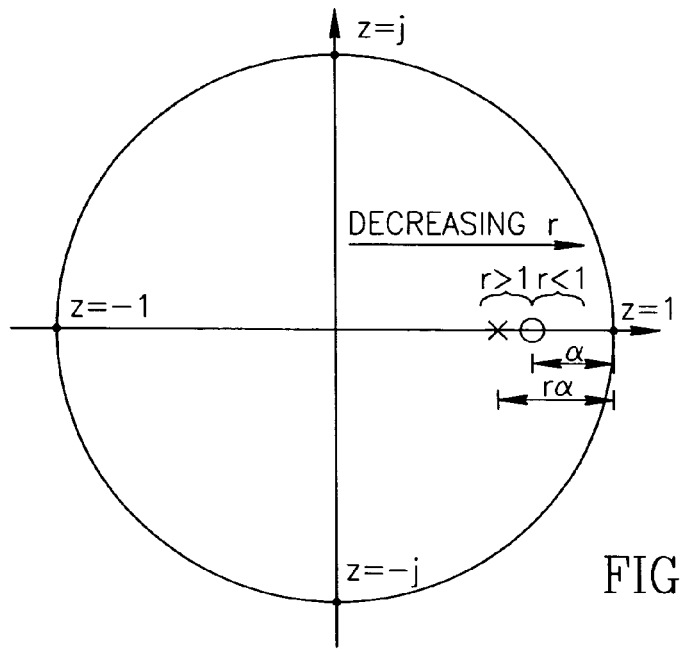
FIG. 3 is a diagram illustrating the complex plane location of the H(z) zero and pole movement with different values of DCO gain estimate accuracy r.

A diagram illustrating the complex plane location of the H(z) zero and pole movement with different values of DCO gain estimate accuracy r is shown in FIG. 3. The zero location is approximately the same (exactly the same for $\alpha=L(z)$ and $\rho=0$) as the PLL phase transfer function loop bandwidth $f_{BW}$ of the reference noise or of the modulating data without the feedforward y[k] entry. As shown in FIG. 3, the feedforward y[k] path could be viewed as placing a compensating zero in the vicinity of the pole. Note that the pole and zero coincide only when the DCO gain estimate is correct, and the direct frequency modulation of the PLL loop exhibits truly wideband all-pass transfer characteristics.

A DCO frequency change due to the $\Delta f_m$ modulating command step will instantly create $r \cdot \Delta f_m$ at the frequency detector variable input. Since the reference input of the frequency detector is $\Delta f_m$, the output of the frequency detector is $(1-r)\Delta f_m$. This value gets accumulated and, after filtering and scaling by $\alpha$, is input as the tuning word to the DCO oscillator. This negative feedback process iterates until the DCO frequency deviation $\Delta f_V$ settles to the desired frequency deviation $\Delta f_m$. The settled value of the loop filter contribution to the normalized tuning word (NTW) is:

$$\Delta NTW (\text{settle}) = -\frac{r-1}{r} \cdot \frac{\Delta f_m}{f_R} \quad (9)$$

The settled value of the phase error in type-I configuration ($\rho=0$) is $$\Delta \phi_E (\text{settle}) = -\frac{r-1}{r} \cdot \frac{\Delta f_m}{f_R} \cdot \frac{1}{\alpha} \quad (10)$$

Figure 4A:
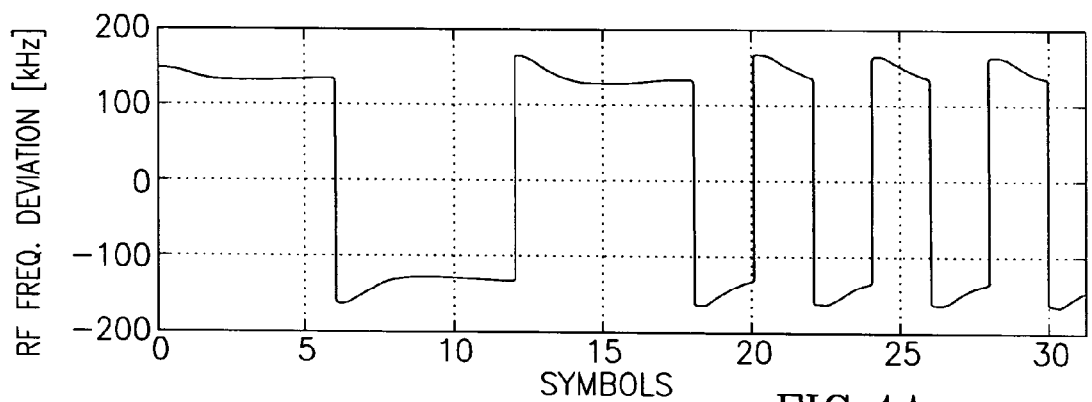
FIG. 4A is a graph of frequency deviation.
Figure 4B:
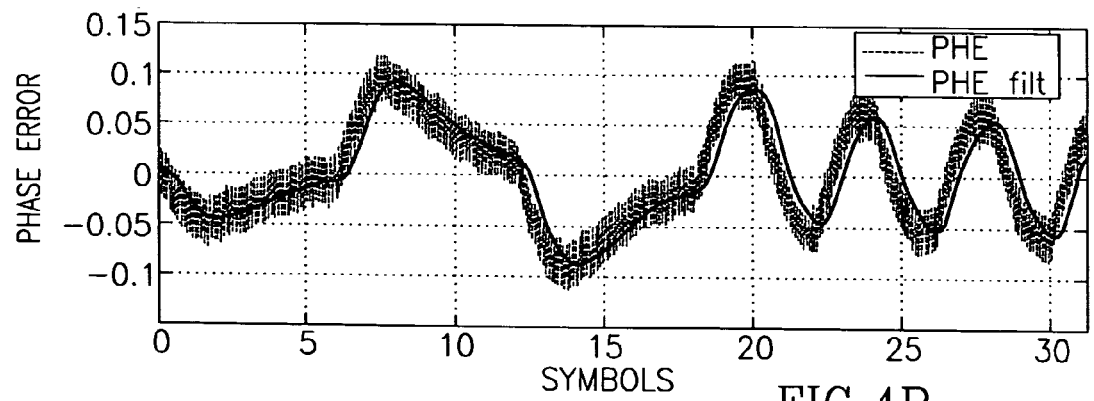
FIG. 4B is a graph of the non-filtered and filtered phase error in the presence of +10% $K_{DCO}$ error.

A graph of frequency deviation $\Delta f_m$ versus number of symbols is shown in FIG. 4A. It should be noted that, in general, the modulating data y[k] need not be rectangular and can exhibit more gradual transitions such as when output from the pulse-shape filter. The rectangular shape is preferred here for illustration purposes. A graph of the non-filtered phase error $\phi_E$ and filtered phase error $\phi_E$ in the presence of +10% $K_{DCO}$ error is shown in FIG. 4B. When the integral term $\rho$ is nonzero, the additional pole at dc slowly forces the phase error $\phi_E$ to zero as shown in FIG. 4B in the region of the first 18 symbols. In this simulation, all phase noise sources are incorporated. These comprise the DCO, FREF and the TDC quantization noise sources. The peak deviation for the low band is $\Delta f_m=2\times 67.7$ kHz. In the region beyond the first 18 symbols, the modulating data transition interval is shortened to two symbols. The ADPLL loop bandwidth will not allow the phase error to fully settle for the data frequency of 270.833 kHz/4=67.7 kHz, so the peaks are now smaller than before.

Figure 5A:
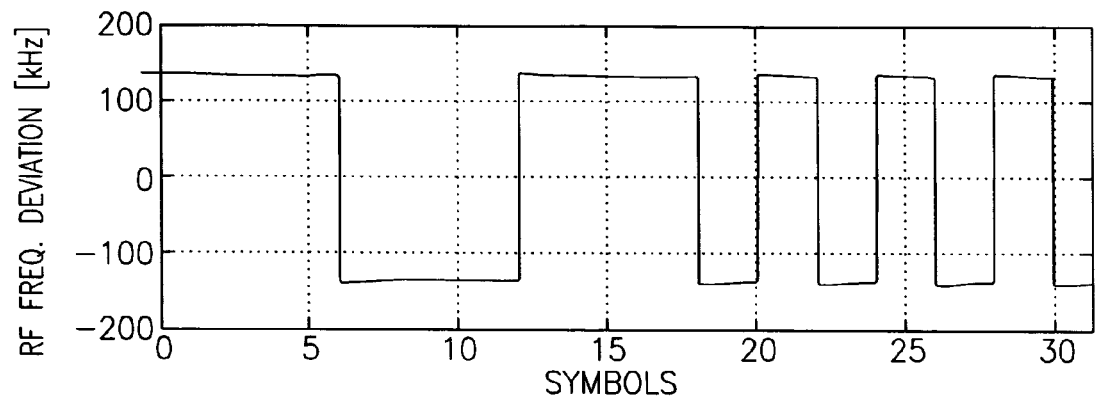
FIG. 5A is a graph of frequency deviation versus number of symbols.
Figure 5B:
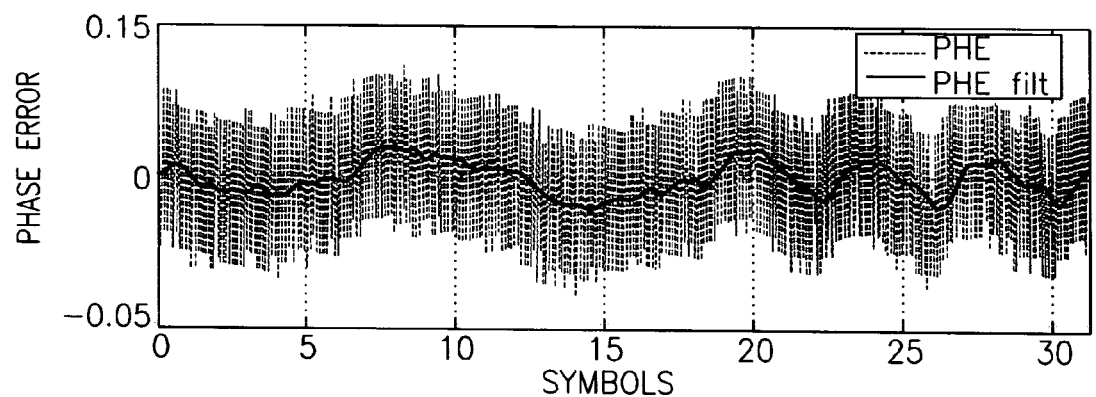
FIG. 5B is a graph of the non-filtered and filtered phase error in the presence of +1% $K_{DCO}$ error.

A clearly defined trajectory of the filtered phase error $\phi_E$ is visible even for the very small $K_{DCO}$ error of +1%, as shown in FIGS. 5A and 5B.

The present invention provides a $K_{DCO}$ adaptation algorithm that exploits the phenomenon described supra. In accordance with the algorithm, upon the zero-crossing of the data FCW, the filtered phase error is sampled after a short predetermined delay (i.e. suggested by FIG. 4). The running $K_{DCO}$ value estimate should be lowered (i.e. $f_R/K_{DCO}$ increased) if the data transition agrees with the sign of the filtered phase error. Similarly, the $K_{DCO}$ estimate should be increased (i.e. $f_R/K_{DCO}$ lowered) if the data transition is opposite that of the filtered phase error. Note that either "data sign/error" or "data sign/error sign" methods may be used. The "data sign/error" method may also take into account an adjustment of the error magnitude for the separation to the previous transition, as suggested by FIG. 4. Alternatively, the predetermined delay can maximally extend to the next data transition. In this case, the developed phase error is sampled at the data transition, so the previous data transition contributes to the developed phase error at the time of the current transition. Since the previous data transition is always opposite that of the current data transition, the decision to lower or increase the $K_{DCO}$ estimate would be opposite to that described above, as FIG. 4 suggests after the first 18 symbols.

Figure 6:
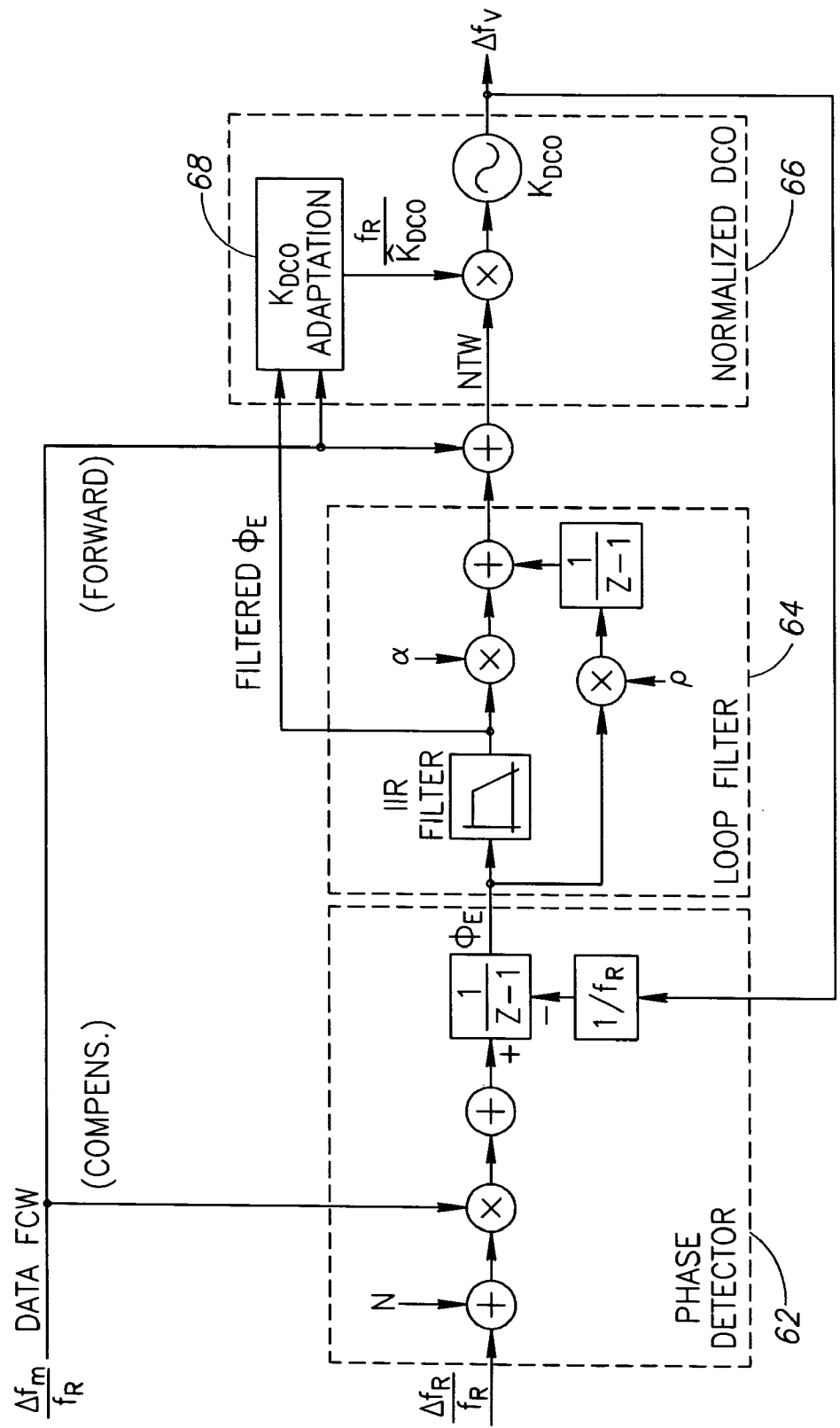
FIG. 6 is a block diagram illustrating a z-domain model of the ADPLL with wideband frequency modulation and incorporating the present invention.

A block diagram illustrating a z-domain model of the ADPLL with wideband frequency modulation and incorporating the present invention is shown in FIG. 6. The model of the ADPLL illustrated, generally referenced 60, is similar to that of FIG. 2 with the addition of the $K_{DCO}$ gain adaptation block 68. The ADPLL model comprises a phase detector portion 62, loop filter portion 64 and normalized DCO portion 66. In operation, the gain adaptation algorithm takes the data FCW and the filtered phase error as inputs and generates the DCO gain multiplier $f_R/\hat{K}_{DCO}$ which is used to scale the tuning word before input to the DCO. It should be pointed out that the adaptation block 68 could take the raw or unfiltered phase error $\phi_E$ or even frequency error $f_E$, instead of the filtered phase error, if appropriate filtering or signal processing is done inside the adaptation block. The filtering and correlation operations can be reversed such that the phase error $\phi_E$ is first correlated with the modulating data and then the correlation result is filtered.

Figure 7:
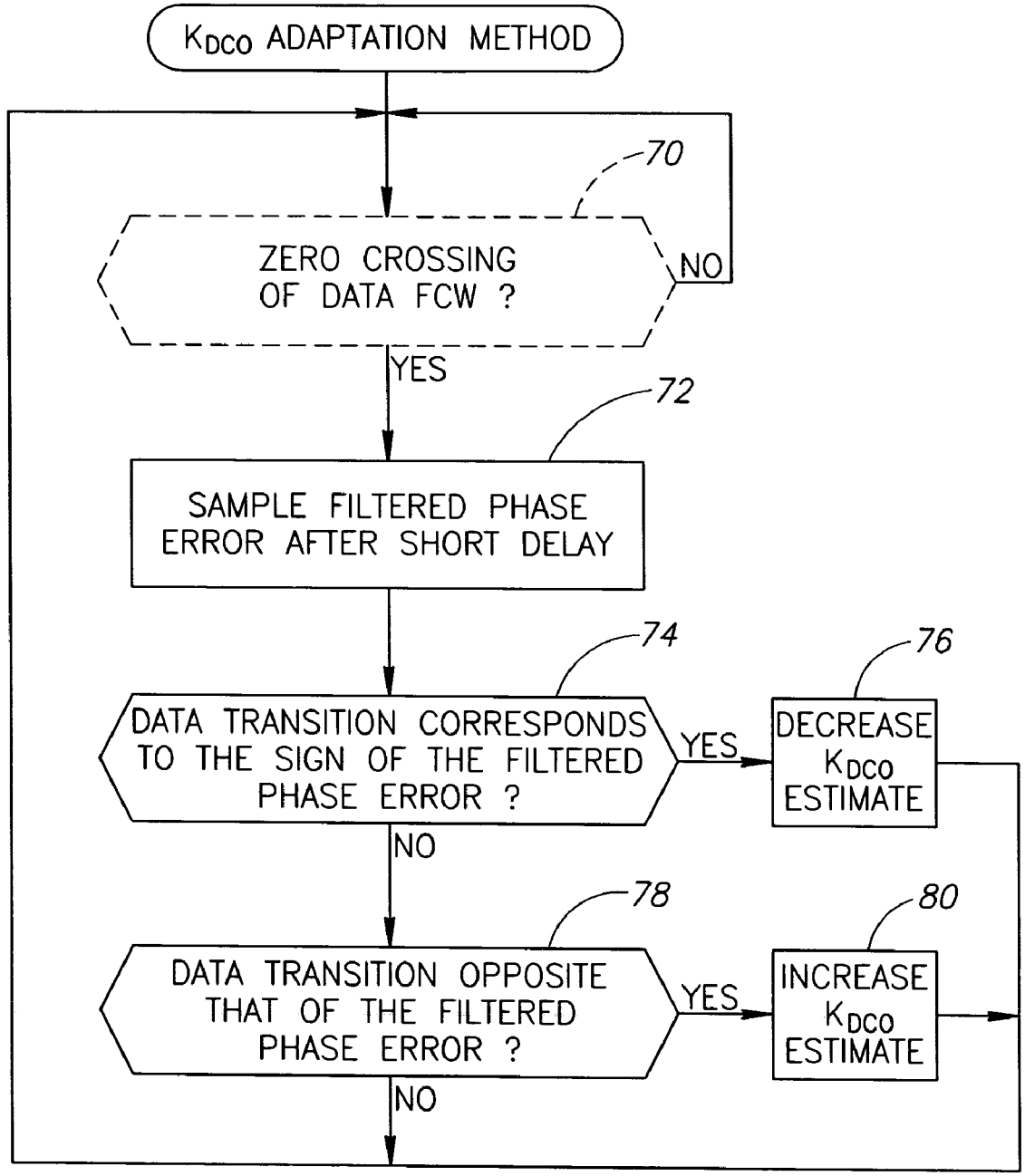
FIG. 7 is a flowchart illustrating the RF digitally controlled oscillator (DCO) gain calibration method of the present invention in more detail.

A flowchart illustrating the RF digitally controlled oscillator (DCO) gain calibration method of the present invention in more detail is shown in FIG. 7. The following algorithm may be implemented in software or may be adapted to be performed in hardware as well, depending on the particular implementation. The algorithm is based on a steepest descent iterative algorithm which is a well-known mathematical technique and is not described in detail herein. First, the zero crossings of the data FCW are detected (step 70). Note that the step of detecting zero crossings is optional, as indicated by the dashed box. After a predetermined delay, the filtered phase error is sampled (step 72). The sampled phase error is correlated (i.e. compared) with the modulating data (i.e. the data FCW). If the data transition corresponds to the sign of the filtered phase error (step 74), the $K_{DCO}$ value is lowered (step 76). If, on the other hand, the data transition is opposite that of the filtered phase error (step 78), the $K_{DCO}$ value is increased (step 80).

Figure 8:
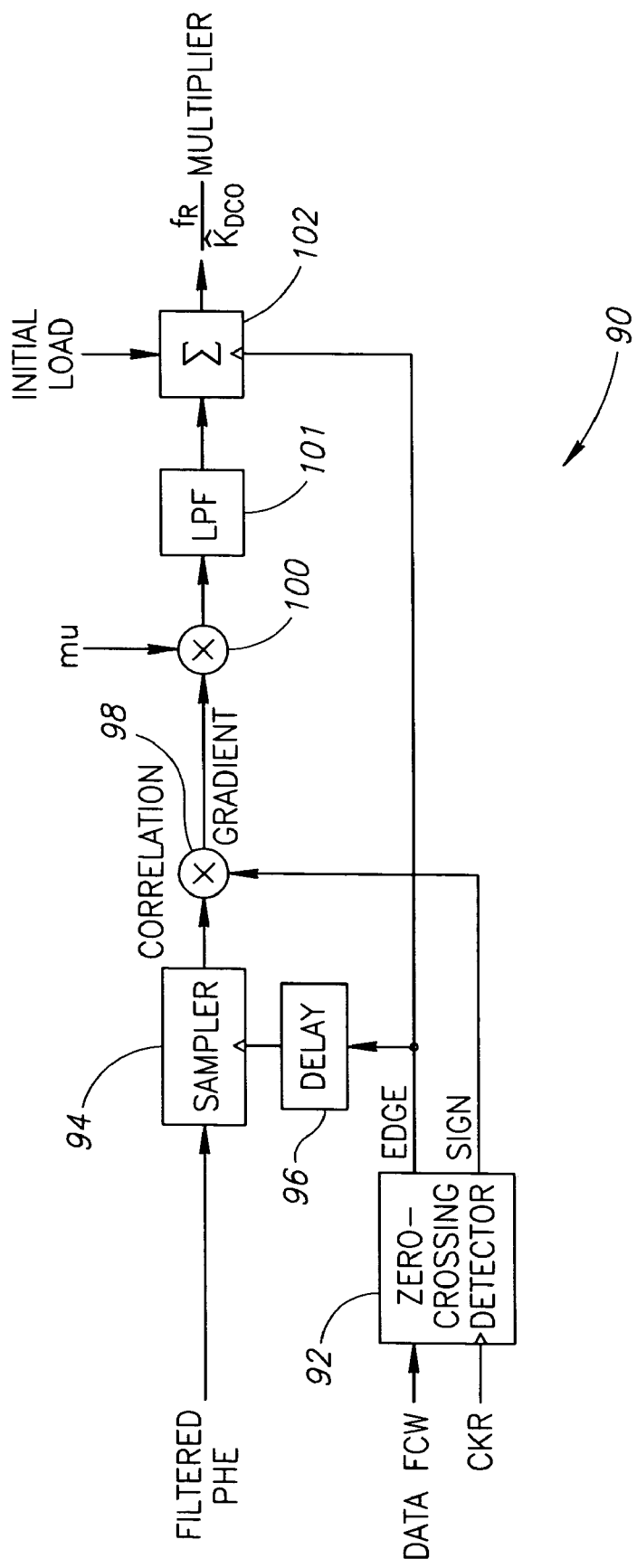
FIG. 8 is a block diagram illustrating the RF DCO gain calibration algorithm implemented as a hardware circuit.

A block diagram illustrating the RF DCO gain calibration algorithm implemented as a hardware circuit is shown in FIG. 8. The LMS based $K_{DCO}$ adaptation circuit of the ADPLL, generally referenced 90, comprises digital zero crossing detector 92, 1-bit signal delay 96, data sampler 94 (i.e. latch), correlator 98, multiplier 100 (e.g., power-of-two left or right bit shift), low pass filter (LPF) 101 and accumulator 102 with parallel load. Note that a benefit of the circuit 90 is that it is energy efficient since it operates only on data transitions. Further, the circuit operates equally well with the "training preamble" (i.e. between the time the loop is settled and the time of the data transmission) as well as with random data during regular transmission.

In operation, the zero crossing detector is operative to generate edge and sign signals from the data FCW and CKR clock. The edge signal is delayed a predetermined time period and used to clock the sampler. The sampler generates a sampled filtered phase error signal from the filtered phase error input thereto. The filtered phase error samples are examined when the modulating data is transitioning, but may also be considered continuously to simplify the circuitry, if transitions are frequent enough (otherwise the mechanism may become susceptible to noise). The sampled phase error is then correlated with the modulating data to generate a gradient 104. The correlator, for example, is adapted to generate the gradient as the 2's complement of its input. The gradient is scaled via multiplier 100 and added to the current value of the DCO gain multiplier via accumulator 102. The output of the accumulator comprises the estimate of the DCO gain multiplier and is used to scale the tuning word before it is input to the DCO. Note that the gain calibration circuit has the advantage of being insensitive to the RF oscillator frequency drift.

Note that the invention is not to be limited to the use of a zero crossing detector. It will be appreciated by one skilled in the art that the invention may be constructed without the zero crossing detector 92 of FIG. 8. In this embodiment, sampling is performed other than at transition instances of the input.

Figure 9A:
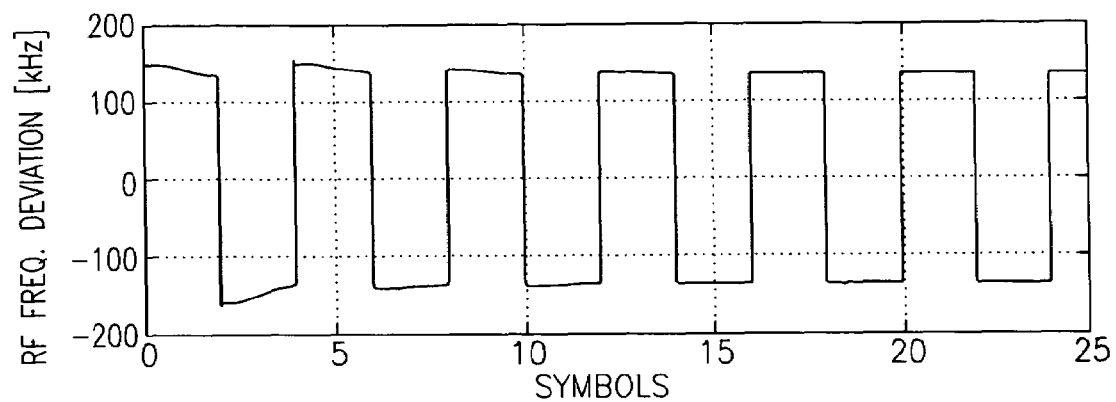
FIG. 9A is a graph illustrating frequency deviation over a plurality of symbols for an initial $K_{DCO}$ error of +10%.
Figure 9B:
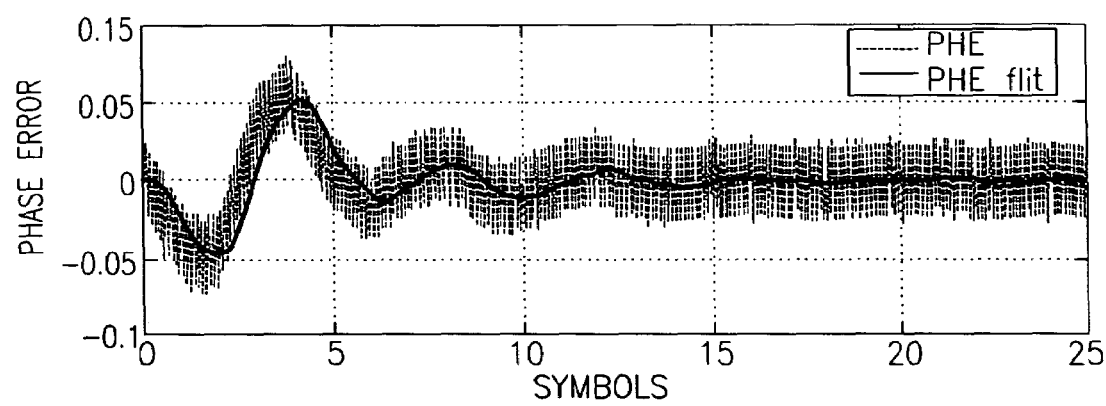
FIG. 9B is a graph illustrating the non-filtered and filtered phase error over a plurality of symbols for an initial $K_{DCO}$ error of +10%.
Figure 9C:
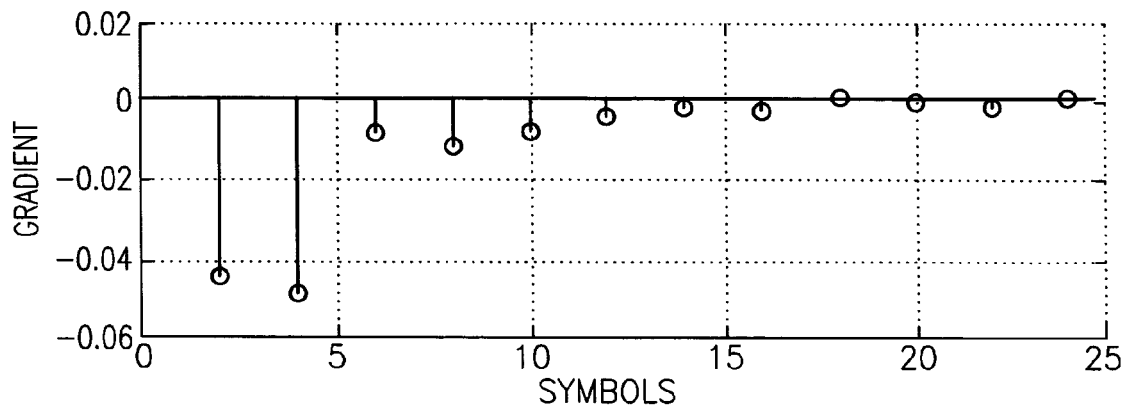
FIG. 9C is a graph illustrating the gradient over a plurality of symbols for an initial $K_{DCO}$ error of +10%.
Figure 9D:
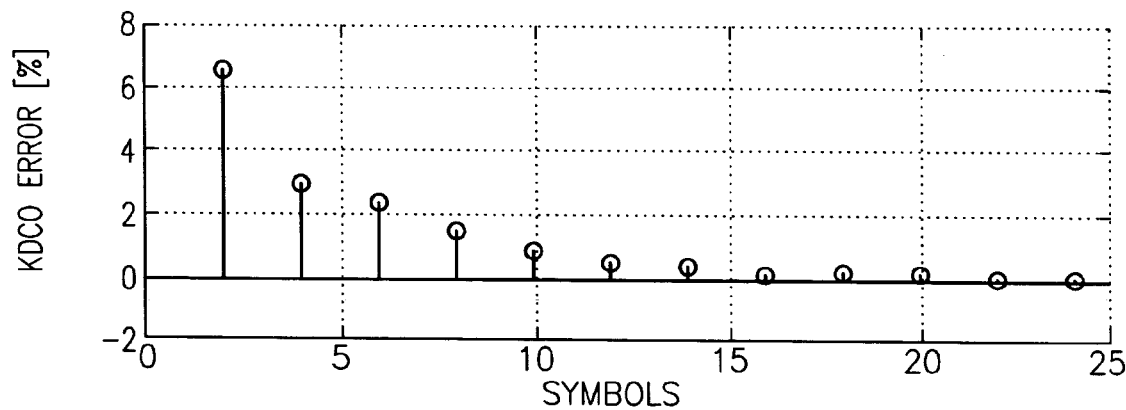
FIG. 9D is a graph illustrating the DCO gain $K_{DCO}$ error convergence over a plurality of symbols for an initial $K_{DCO}$ error of +10%.

Simulation results of the $K_{DCO}$ gain adaptation algorithm of the present invention are presented below. A graph illustrating frequency deviation over a plurality of symbols for an initial $K_{DCO}$ error of +10% is shown in FIG. 9A. A graph illustrating the non-filtered and filtered phase error over a plurality of symbols is shown in FIG. 9B. A graph illustrating the gradient over a plurality of symbols for an initial $K_{DCO}$ error of +10% is shown in FIG. 9C and a graph illustrating the DCO gain $K_{DCO}$ error convergence over a plurality of symbols for an initial $K_{DCO}$ error of +10% is shown in FIG. 9D. FIGS. 9A–9D show the simulation results of the $K_{DCO}$ adaptation algorithm for the initial $K_{DCO}$ error of +10%. Note that the $K_{DCO}$ error settles to within 1% error within only 10 symbols which corresponds to less than 40 µs. In most cases, however, a much less stricter tolerance would be sufficient.

Figure 10:
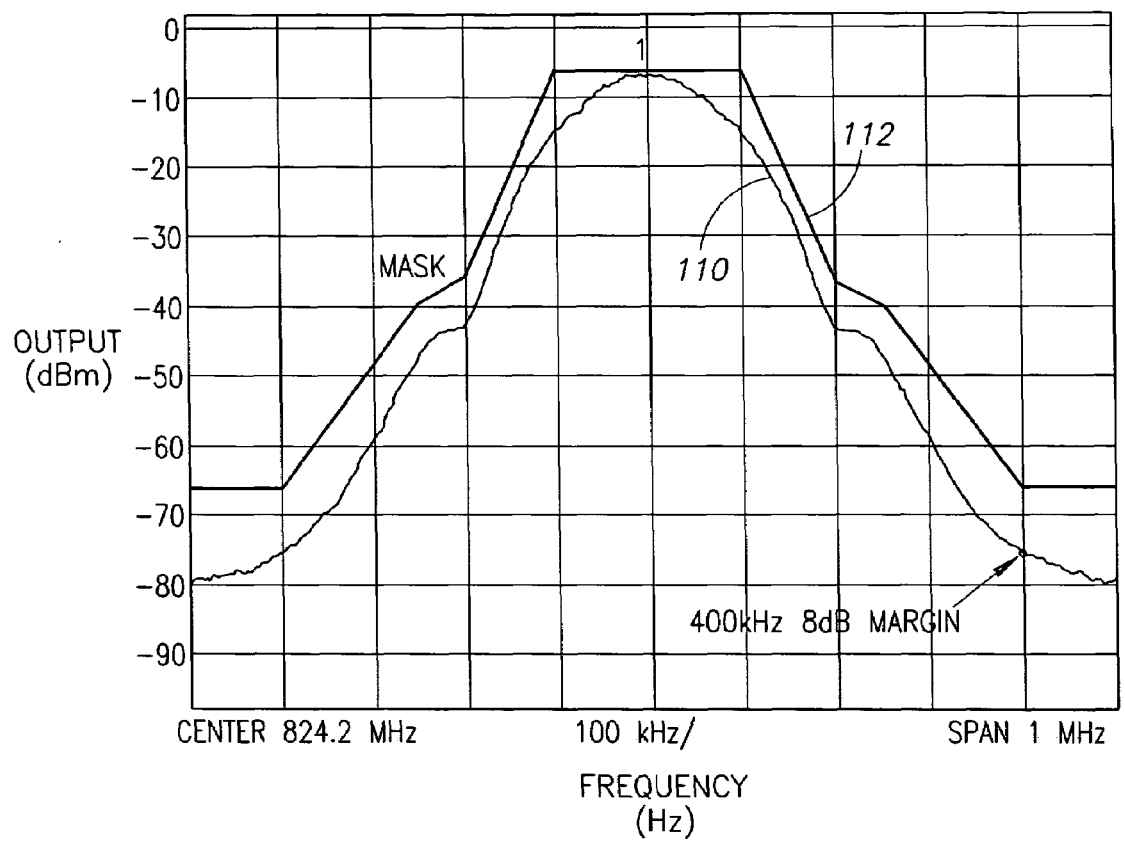
FIG. 10 is a graph illustrating a measured GSM output spectrum of a transmitter incorporating the gain calibration scheme of the present invention.

The example transmitter described herein fully meets the GSM specifications. A graph illustrating a measured GSM output spectrum of a sample system incorporating the gain calibration scheme of the present invention is shown in FIG. 10. The representative modulated spectrum 110 is shown with a resolution bandwidth of 30 kHz against the GSM mask 112. The 400 kHz frequency offset point has an 8 dB of margin against the specification of −60 dB. The measured modulated rms phase error is 0.5 degrees versus the allowed limit of 5 degrees.

Figure 11A:
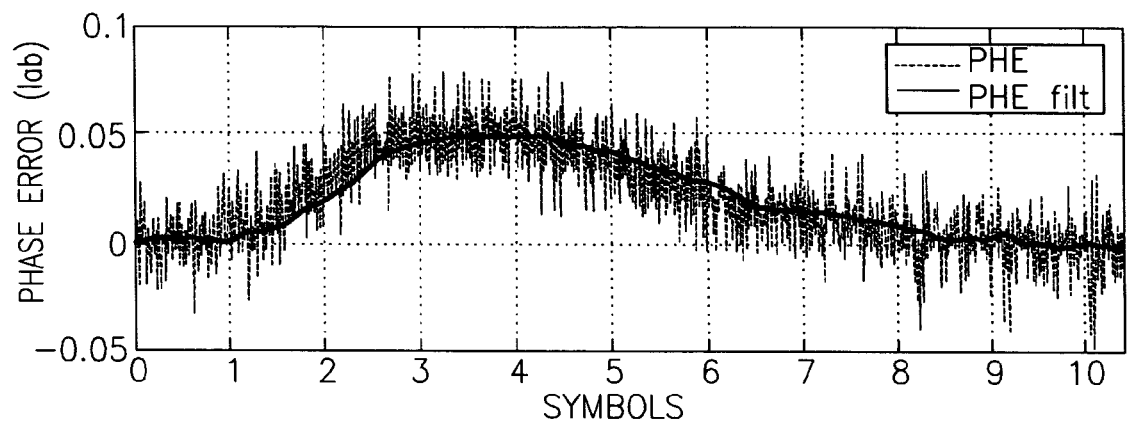
FIG. 11A is a graph illustrating the measured non-filtered and filtered phase error trajectory with initial −10% $K_{DCO}$ error.
Figure 11B:
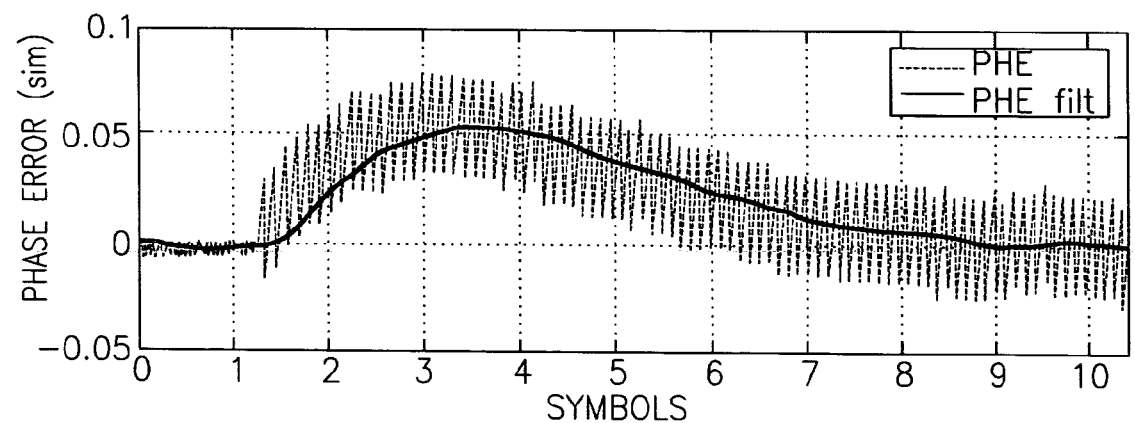
FIG. 11B is a graph illustrating the simulated non-filtered and filtered phase error trajectory with initial −10% $K_{DCO}$ error.

The integrated circuit (IC) chip incorporating the transmitter, comprises an internal SRAM memory adapted to store a burst (i.e. packet) of transmit and receive data. The internal memory is also used to capture high-rate internal signals for post-processing and analysis. A graph illustrating the measured non-filtered and filtered phase error trajectory with initial −10% $K_{DCO}$ error is shown in FIG. 11A. A graph illustrating the simulated non-filtered and filtered phase error trajectory with initial −10% KDCO error is shown in FIG. 11B. FIGS. 11A and 11B demonstrate agreement between the measured and simulated captured phase error $\phi_E$ and filtered phase error $\phi_E$ trajectory in response to the 2×67.7 kHz frequency step.

Figure 12A:
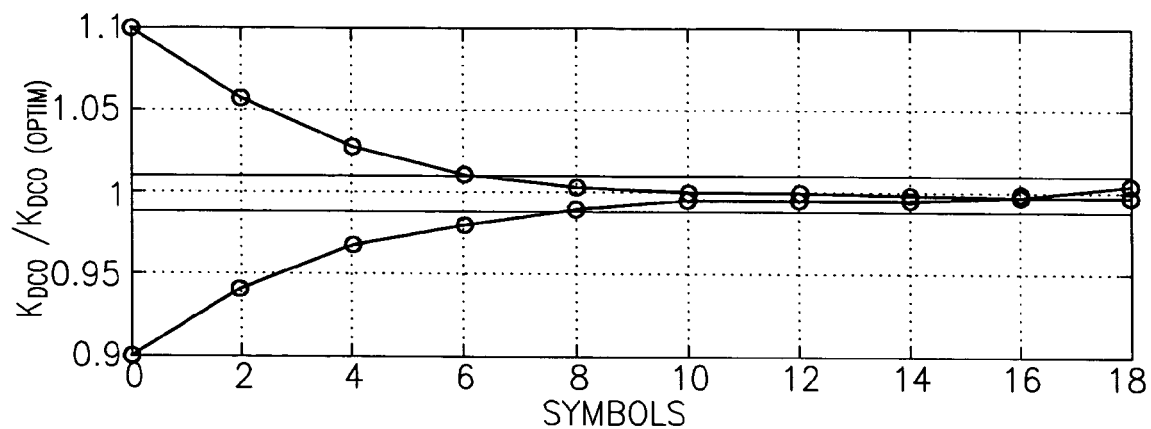
FIG. 12A is a graph illustrating the measured $K_{DCO}$ adaptation convergence for the initial $K_{DCO}$ error of ±10% zoomed into the first 18 symbols.
Figure 12B:
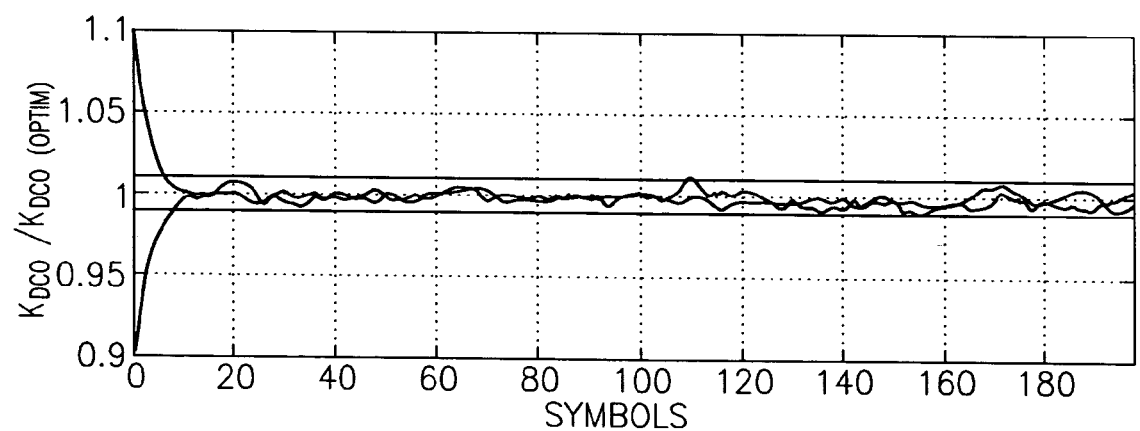
FIG. 12B is a graph illustrating the measured $K_{DCO}$ adaptation convergence for the initial $K_{DCO}$ error of ±10% over a period of 200 symbols.

A graph illustrating the measured $K_{DCO}$ adaptation convergence for the initial $K_{DCO}$ error of ±10% zoomed into the first 18 symbols is shown in FIG. 12A. A graph illustrating the measured $K_{DCO}$ adaptation convergence for the initial $K_{DCO}$ error of ±10% over a period of 200 symbols is shown in FIG. 12B. FIGS. 12A and 12B illustrate the trajectory of the captured $K_{DCO}$ adaptation for the modulating data of 00110011..., similar to the conditions in FIGS. 9A–9D, but with both +10% and −10% of the initial $K_{DCO}$ error. It is noted that convergence to within ±1% is obtained after only 8 symbols, which is significantly below the GSM requirement of 7%.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of gain calibration of a digitally controlled oscillator (DCO), said method comprising the steps of:
    sampling a phase error signal continuously or upon zero crossing of an input data frequency control word (FCW) to generate phase error samples therefrom;
    generating a gradient in accordance with said phase error sample and a sign of said data FCW; and
    adjusting an oscillator gain estimate K in accordance with said gradient.

2. The method according to claim 1, wherein said phase error signal is sampled after a predetermined delay following an input transition.

3. The method according to claim 2, wherein said predetermined delay is substantially zero.

4. The method according to claim 1, wherein said phase error signal comprises a filtered phase error.

5. The method according to claim 1, further comprising the step of multiplying said gradient by a scale factor before adjusting said oscillator gain estimate K.

6. The method according to claim 1, wherein said step of adjusting comprises the step of decreasing said oscillator gain estimate K if the transition, sample, or sign of said data FCW correlates with said phase error sample.

7. The method according to claim 1, wherein said step of adjusting comprises the step of increasing said oscillator gain estimate K if the transition, sample, or sign of said data FCW does not correlate with said phase error sample.

8. The method according to claim 1, adapted to be implemented in an Application Specific Integrated Circuit (ASIC).

9. The method according to claim 1, adapted to be implemented in a Field Programmable Gate Array (FPGA).

10. A method of gain calibration of a digitally controlled oscillator (DCO) for use in an all-digital phase locked loop (ADPLL), said method comprising the steps of:

sampling ADPLL phase error to generate a phase error sample;

correlating said phase error sample with modulation data to generate a gradient;

scaling said gradient to generate a scaled gradient; and adding said scaled gradient to a current value of DCO gain multiplier to generate an updated DCO gain multiplier.

11. The method according to claim 10, wherein said ADPLL phase error comprises filtered ADPLL phase error.

12. The method according to claim 10, wherein said phase error is sampled at zero crossings of a data frequency control word (FCW).

13. The method according to claim 10, wherein said phase error is sampled continuously regardless of transitions of an input data frequency control word (FCW).

14. The method according to claim 10, wherein said phase error is sampled after a predetermined delay from the input transitions.

15. The method according to claim 10, wherein said step of adding comprises accumulating said DCO gain estimate.

16. The method according to claim 10, wherein said DCO gain multiplier is increased if the transition or value of said modulation data correlates with the sign of said phase error sample.

17. The method according to claim 10, wherein said DCO gain multiplier is decreased if the transition or value of said modulation data does not correlate with the sign of said phase error sample.

18. The method according to claim 10, wherein said ADPLL comprises frequency modulation means.

19. The method according to claim 10, adapted to be implemented in an Application Specific Integrated Circuit (ASIC).

20. The method according to claim 10, adapted to be implemented in a Field Programmable Gate Array (FPGA).

21. An apparatus for gain calibration of a digitally controlled oscillator (DCO), comprising:

a sampler operative to sample a phase error input and to output phase error samples therefrom;

gradient means for generating a gradient as a function of said phase error samples and the sign of modulating data;

scaling means operative to generate a scaled gradient from the output of said gradient means; and an accumulator operative to add said scaled gradient to a current value of a DCO gain multiplier value.

22. The apparatus according to claim 21, further comprising a zero crossing detector operative to detect transitions of said modulating data wherein said sampler is operative to sample said phase error input in accordance with the output of said zero crossing detector.

23. The apparatus according to claim 21, wherein said phase error input comprises a filtered phase error input.

24. The apparatus according to claim 21, further comprising a delay operative to delay sampling said phase error input by a predetermined time delay.

25. The apparatus according to claim 21, wherein said gradient means comprises means for correlating said phase error sample with said modulating data.

26. The apparatus according to claim 21, wherein said gradient means comprises means for inverting the sign of said sampled phase error.

27. The apparatus according to claim 21, wherein said scaling means comprises a multiplier operative to multiply said gradient with a scaling factor.

28. The apparatus according to claim 21, adapted to be implemented in an Application Specific Integrated Circuit (ASIC).

29. The apparatus according to claim 21, adapted to be implemented in a Field Programmable Gate Array (FPGA).

30. An apparatus for generating a digitally controlled oscillator (DCO) gain multiplier, comprising:

means for sampling a phase error to generate a phase error sample;

means for correlating said phase error sample with modulation data to generate a gradient;

means for scaling said gradient to generate a scaled gradient; and means for adding said scaled gradient to a current value of DCO gain multiplier to generate an updated DCO gain multiplier.

31. The apparatus according to claim 30, wherein said phase error is sampled at zero crossings of a data frequency control word (FCW).

32. The apparatus according to claim 30, wherein said phase error is sampled continuously regardless of transitions of an input data frequency control word (FCW).

33. The apparatus according to claim 30, wherein said means for sampling is operative to sample said phase error after a predetermined delay period from the input transitions.

34. The apparatus according to claim 30, wherein said DCO gain multiplier is increased if the transition of said modulation data correlates with the sign of said phase error sample.

35. The apparatus according to claim 30, wherein said DCO gain multiplier is decreased if the transition of said modulation data does not correlate with the sign of said phase error sample.

36. The apparatus according to claim 30, wherein said phase error comprises a filtered phase error.

37. The apparatus according to claim 30, adapted to be implemented in an Application Specific Integrated Circuit (ASIC).

38. The apparatus according to claim 30, adapted to be implemented in a Field Programmable Gate Array (FPGA).

39. A transmitter comprising:

a frequency synthesizer for performing a frequency modulation; said frequency synthesizer comprising a digitally controlled oscillator (DCO);

a gain calibration circuit of the digitally controlled oscillator, said gain calibration circuit comprising:

means for sampling a phase error to generate a phase error sample;

means for correlating said phase error sample with modulation data to generate a gradient;

means for scaling said gradient to generate a scaled gradient; and means for adding said scaled gradient to a current value of DCO gain multiplier to generate an updated DCO gain multiplier.

* * * * *